United States Patent [19]

Golin

[11] Patent Number: 5,748,790
[45] Date of Patent: May 5, 1998

[54] TABLE-DRIVEN STATISTICAL DECODER

[75] Inventor: Stuart J. Golin, East Windsor, N.J.

[73] Assignee: Intel Corporation, Santa Clara, Calif.

[21] Appl. No.: 417,381

[22] Filed: Apr. 5, 1995

[51] Int. Cl.$^6$ .............................. G06K 9/36; G06K 9/46; H03M 7/00; H03M 7/40
[52] U.S. Cl. ...................... 382/246; 358/427; 341/67; 341/106
[58] Field of Search ...................... 382/233, 246, 382/245, 232; 341/65, 67, 106, 107; 358/427; 375/253

[56] References Cited

U.S. PATENT DOCUMENTS

| | | | |
|---|---|---|---|
| 3,883,847 | 5/1975 | Frank | 340/146.1 |
| 4,369,463 | 1/1983 | Anastassiou | 358/135 |
| 4,386,416 | 5/1983 | Giltner | 364/900 |
| 4,396,906 | 8/1983 | Weaver | 340/347 |
| 4,563,671 | 1/1986 | Lim et al. | 340/347 |
| 4,574,382 | 3/1986 | Ko | 375/25 |
| 4,580,162 | 4/1986 | Mori | 358/135 |
| 4,593,267 | 6/1986 | Kuroda et al. | |
| 4,700,175 | 10/1987 | Bledsoe | 340/375 |
| 4,706,265 | 11/1987 | Furukawa | 375/122 |
| 4,782,464 | 11/1988 | Gray et al. | 364/900 |
| 4,813,056 | 3/1989 | Fedele | 375/27 |
| 4,899,149 | 2/1990 | Kahan | 341/67 |
| 4,967,196 | 10/1990 | Sprague et al. | 341/67 |
| 5,045,853 | 9/1991 | Astle et al. | 341/67 |
| 5,057,917 | 10/1991 | Shalkauser et al. | 358/135 |
| 5,220,325 | 6/1993 | Ackland et al. | 341/67 |
| 5,253,053 | 10/1993 | Chu et al. | 382/233 |
| 5,268,769 | 12/1993 | Tsuchiya et al. | 358/427 |
| 5,304,995 | 4/1994 | Dachiku | 341/67 |
| 5,329,313 | 7/1994 | Keith | 348/422 |
| 5,528,628 | 6/1996 | Park et al. | 375/240 |
| 5,572,208 | 11/1996 | Wu | 341/67 |

FOREIGN PATENT DOCUMENTS

| | | |
|---|---|---|
| 0145396 | 6/1985 | European Pat. Off. . |
| 8905556 | 6/1989 | European Pat. Off. . |

OTHER PUBLICATIONS

Ma et al. "Programmable and Parallel Variable–Length Decoder for Video Systems" in IEEE Transactions on Consumer Electronics, vol. 39, No. 3, Aug. 1993, pp. 448–454.

Ooi et al. "A 162 Mbit/s Variable Length Decoding Circuit using an Adaptive Tree Search Method" IEEE 1994 Custom Integrated Circuits Conference, pp. 107–110.

"DVI Image Compression—Second Generation," by Stuart J. Golin, Image Processing Algorithms and Techniques III, SPIE vol. 1657, Proceedings of the International Society for Optical Engineering, 1992, pp. 106–113.

Abramson, N., Information Theory and Coding, McGraw-Hill 1963, pp. 77–92.

"The i750 Video Processor: A Total Multimedia Solution," Communications of the ACM, vol. 34, No. 4, Apr. 1991, New York, pp. 64–78.

Patent Abstracts of Japan, vol. 11, No. 83, (E–489) (2530), Mar. 13, 1987, entitled "Data Processing Method" and JP,A61237520 (Canon, Inc.) 22 Oct. 1986.

Primary Examiner—Leo Boudreau
Assistant Examiner—Bhavesh Mehta
Attorney, Agent, or Firm—Duane, Morris & Heckscher LLP

[57] ABSTRACT

An apparatus and computer-implemented method for decoding code words of an encoded bitstream associated with a variable-length code. According to a preferred embodiment, a processor forms a byte having BS bits in accordance with bits of the encoded bitstream and in accordance with any unused bits remaining after decoding a previous code word. The byte is applied to a table, and if the byte comprises at least one complete code word, then the table means produces at least one decoded symbol corresponding to the at least one complete code word, and a plurality of unused bits comprised of bits of the byte not within the at least one complete code word is determined.

16 Claims, 6 Drawing Sheets

FIGURE 1. ENCODING SYSTEM

FIGURE 2. DECODING SYSTEM

TABLE-DRIVEN STATISTICAL DECODER

BACKGROUND OF THE INVENTION

1. Field of the Invention

The present invention relates to signal processing and, in particular, to computer-implemented processes and apparatuses for signal processing with statistical decoders.

2. Description of the Related Art

This invention relates to signal processing which is often utilized to compress symbols into an encoded bitstream of code words and to decompress the encoded code words to provide the original symbols. The encoded symbols can relate to various types of data, such as video pictures or ASCII text strings. Symbols encoded can thus correspond to letters or other characters, numbers, signal intensity or amplitude values, quantized discrete cosine transform (DCT) coefficients representative of an image, or motion vectors used in image processing, inter alia. A string of symbols to be encoded into code words is sometimes referred to as a message.

There is usually a statistical probability distribution among the symbols constituting the set of symbols constituting a message. Such symbols are often encoded and decoded using variable-length coding (VLC). Symbols are encoded into an encoded bitstream containing code words, and the association of symbols and code words is referred to as the code. In VLC techniques, code words of varying bit lengths are transmitted or stored for each symbol rather than transmitting or storing the symbol itself, with more common or probable symbols being represented by code words with a relatively small number of bits, and less probable symbols represented by code words with a relatively large number of bits. Because more common symbols need to be encoded more often than less probable symbols, efficiency in terms of encoded bits can be achieved if the code is constructed to accurately account for the statistics of the symbol set of the message(s) being encoded. Such encoding techniques are described in William B. Pennebaker & Joan L. Mitchell, *JPEG: Still Image Data Compression Standard* (New York: Van Nostrand Reinhold, 1993), chapters 8 and 11 of which are incorporated herein by reference.

One method known in the prior art for statistically encoding symbols in this manner is the use of an optimal VLC such as a Huffman code. To use a Huffman code, a symbol set representative of typical messages to be encoded is put in order, from the most frequently occurring symbols to the least frequently occurring symbols. A Huffman code is then generated using, for example, the algorithm described at pages 77–85 of *Information Theory and Coding* by N. Abramson, McGraw Hill, 1963, pages 77–85 of which are incorporated by reference herein. The code is typically stored, in both encoders and decoders, in a code table. The Huffman code or tree is then used in both encoding symbols into code words and in decoding the code words back into symbols.

Conventional methods for decoding Huffman and other VLCs represent the codes as binary trees. Starting at the root of a tree, successive bits of a code word are received from the encoded bitstream. Depending on whether the bit is a 0 or 1, the decoder branches down to a node of the tree to the left or right, thereby traversing the tree. When a terminal node or leaf of the binary tree is reached, the traversal is complete and the decoded value of the symbol is determined from a table.

A typical Huffman code comprises a set of Huffman binary bit streams or code words, $\{H_i\}$. Each code word $H_i$ of a Huffman code has a unique decoded value $V_i$. It is not necessary that the decoded values $V_i$ be the integers 0, 1, 2, ... in a predetermined order. The more general case is permitted wherein each code word $H_i$ may be mapped onto an index, $I_i$, which is one of the integers $\{0, 1, 2, \ldots\}$, and each $I_i$ is mapped by another one-to-one function into the final decoded value $V_i$. In some applications a bitstream comprising code words $H_i$ may be decoded directly to yield decoded values $V_i$, while in some applications a two step mapping, $H_i \rightarrow I_i \rightarrow V_i$, may be utilized.

Binary tree decoding methods proceed one bit at a time, which may result in slow decoding for code words having a large number of bits. Decoding in this fashion may be relatively slow even for short code words. For example, conventional tree traversal techniques used in decoding VLCs may require five instructions per bit of the encoded symbol in conventional video processors. In some typical applications, Huffman symbols tend to average about four bits each. Thus, approximately 20 instructions, or about 80 cycles, per decoded symbol may be required on a conventional video processor. At approximately 300,000 symbols per second, a typical symbol rate for 30 frames per second video displays, this results in bandwidth usage of 24 MHz. This amount of processing can require a significant portion of the available processing and transmission capacity of typical video processing systems.

There is thus a need for more efficient statistical decoding methods and apparatuses that reduce the need to use conventional tree traversal techniques.

SUMMARY

There is provided herein an apparatus and computer-implemented method for decoding code words of an encoded bitstream associated with a variable-length code. According to a preferred embodiment of the invention, a processor forms a byte having BS bits in accordance with bits of the encoded bitstream and in accordance with any unused bits remaining after decoding a previous code word. The byte is applied to a table, and if the byte comprises at least one complete code word, then the table means produces at least one decoded symbol corresponding to the at least one complete code word, and a plurality of unused bits comprised of bits of the byte not within the at least one complete code word is determined.

BRIEF DESCRIPTION OF THE DRAWINGS

These and other features, aspects, and advantages of the present invention will become more fully apparent from the following description, appended claims, and accompanying drawings in which:

DESCRIPTION OF THE PREFERRED EMBODIMENT

Video Processing System Hardware

Figure 1:
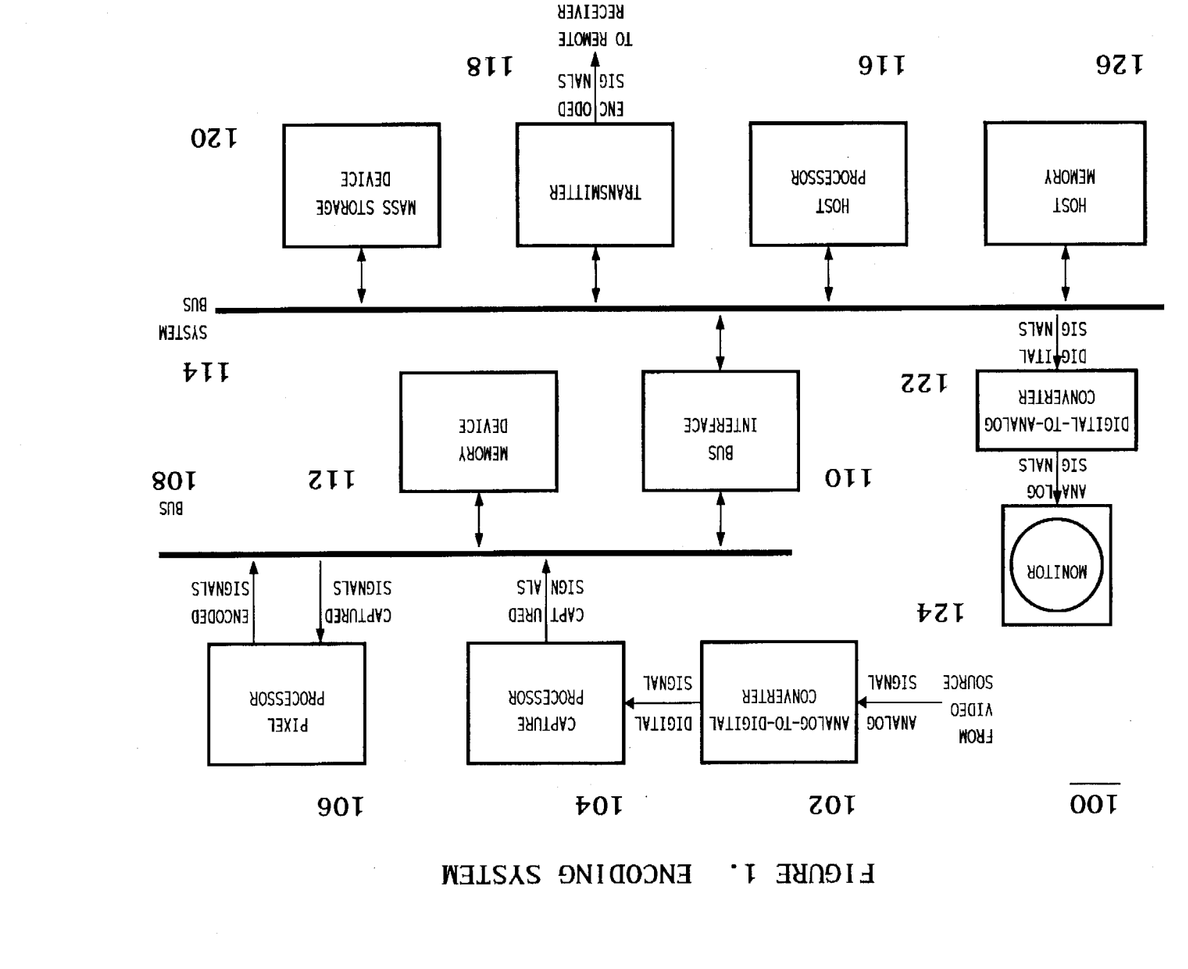
FIG. 1 is a computer-based video signal processing system for encoding video signals, according to a preferred embodiment of the present invention.

Referring now to FIG. 1, there is shown a computer-based signal encoding system 100 for encoding signals representative of data, according to a preferred embodiment of the present invention. Encoding system 100 may be utilized to encode data signals comprising various types of symbol sets, such as video data. Encoding system 100 is described herein with reference to the encoding of data representative of video images, e.g. representative of the coefficients of a discrete cosine transform (DCT), or of motion vectors calculated using in motion estimation techniques. In general, such symbols represent data that may already be transformed by other techniques, and that are to be encoded via arithmetic or Huffman encoding before transmission or storage. Those skilled in the art will appreciate that encoding systems may also be utilized to encode symbols representative of non-video forms of data as well, such as audio or textual data.

Analog-to-digital (A/D) converter 102 of encoding system 100 receives analog video image signals from a video source. The video source may be any suitable source of analog video image signals such as a video camera or VCR for generating local analog video image signals or a video cable or antenna for receiving analog video image signals from a remote source. A/D converter 102 decodes (i.e., separates the signal into constituent components) and digitizes each frame of the analog video image signals into digital image component signals (e.g., in a preferred embodiment, Y, U, and V component signals).

Capture processor 104 receives, captures, and stores the digitized component signals as subsampled video images in memory device 112 via bus 108. Each subsampled video image is represented by a set of two-dimensional component planes or pixel bitmaps, one for each component of the digitized video image signals. In a preferred embodiment, capture processor 104 captures video image signals in a YUV9 or YUV4:1:1 format, in which every (4×4) block of pixels of the Y component plane corresponds to a single pixel in the U component plane and a single pixel in the V component plane.

Pixel processor 106 accesses captured bitmaps from memory device 112 via bus 108 and generates encoded image signals that represent one or more of the captured video images. Depending upon the particular encoding method implemented, as described in more detail below, pixel processor 106 applies a sequence of compression techniques to reduce the amount of data used to represent the information in each image. The encoded bitstream representative of the image may then be stored to memory device 112 via bus 108 for transmission to host processor 116 via bus 108, bus interface 110, and system bus 114 for storage in host memory 126.

Host processor 116 may transmit the encoded image to transmitter 118 for real-time transmission to a remote receiver (not shown in FIG. 1), store the encoded image to mass storage device 120 for future processing, or both. In addition, digital-to-analog converter 122 may receive and convert digital image signals to analog image signals for display in one or more windows on monitor 124. These image signals may correspond, for example, to raw captured video images or companded video images (i.e., the results of compressing and decompressing selected captured video images).

Figure 2:
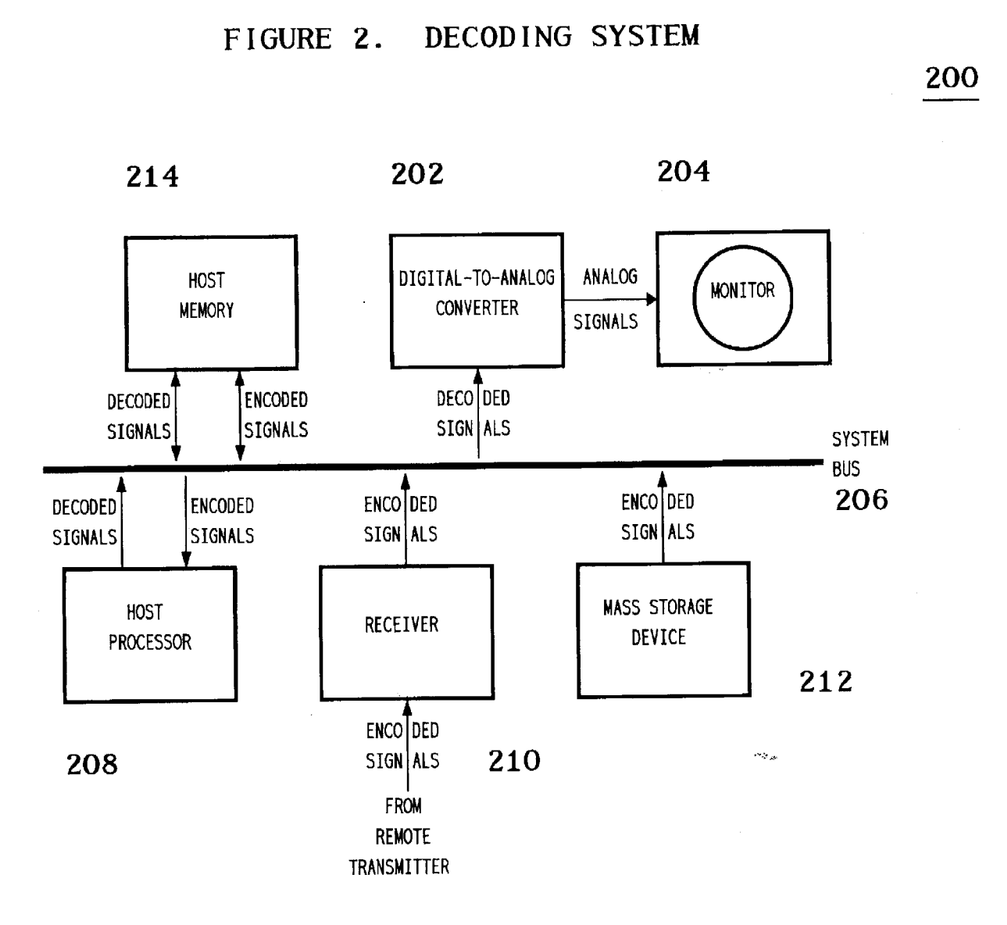
FIG. 2 is a computer-based decoding system for decoding the video signals encoded by the video processing system of FIG. 1, according to a preferred embodiment of the present invention.

Referring now to FIG. 2, there is shown a computer-based decoding system 200 for decoding the image signals encoded by encoding system 100 of FIG. 1, according to a preferred embodiment of the present invention. Host processor 208 of decoding system 200 receives encoded image signals via system bus 206 that were either stored in mass storage device 212 or received by receiver 210 from a remote transmitter, such as transmitter 118 of FIG. 1. The host processor 208 temporarily stores the encoded image signals in host memory 214.

Host processor 208 decodes the encoded image signals and scales the decoded image signals for display. Decoding the encoded image signals involves undoing the compression processing implemented by pixel processor 106 of encoding system 100 of FIG. 1. Scaling the decoded image signals involves upsampling the U and V component signals to generate full-sampled Y, U, and V component signals in which there is a one-to-one-to-one correspondence between Y, U, and V pixels in the scaled component planes. Scaling may also involve scaling the component signals to a display size and/or resolution different from the image signals as original captured. Host processor 208 then stores the scaled decoded image signals to host memory 214 for eventual transmission to digital-to-analog (D/A) converter 202 via system bus 206. D/A converter converts the digital scaled decoded image signals to analog image signals for display on monitor 204.

Referring again to FIG. 1, encoding system 100 is preferably a general microprocessor-based personal computer (PC) system with a special purpose video-processing plug-in board. In particular, A/D converter 102 may be any suitable means for decoding and digitizing analog video image signals. Capture processor 104 may be any suitable processor for capturing digitized video image component signals as subsampled frames. Pixel processor 106 may be any suitable means for encoding subsampled video image signals, where the means is capable of implementing a forward discrete cosine transform. Memory device 112 may be any suitable computer memory device and is preferably a video random access memory (VRAM) device. Bus 108 may be any suitable digital signal transfer device and is preferably an Industry Standard Architecture (ISA) bus or Extended ISA (EISA) bus. Bus interface 110 may be any suitable means for interfacing between bus 108 and system bus 114. In a preferred embodiment, A/D converter 102, capture processor 104, pixel processor 106, bus 108, bus interface 110, and memory device 112 are contained in a single plug-in board, such as an Intel® ActionMedia®-II board, capable of being added to a general microprocessor-based personal computer (PC) system.

Host processor 116 may be any suitable means for controlling the operations of the special-purpose video processing board and is preferably an Intel® general purpose microprocessor such as an Intel® 386, 486, or Pentium® processor. Host memory 126 may be any suitable memory device used in conjunction with host processor 116 and is preferably a combination of random access memory (RAM) and read-only memory (ROM). System bus 114 may be any suitable digital signal transfer device and is preferably an Industry Standard Architecture (ISA) bus or Extended ISA (EISA) bus. Mass storage device 120 may be any suitable means for storing digital signals and is preferably a computer hard drive. Transmitter 118 may be any suitable means for transmitting digital signals to a remote receiver and preferably transmits digital signals over PSTN lines. Those skilled in the art will understand that the encoded video signals may be transmitted using any suitable means of transmission such as telephone line (PSTN or ISDN), RF antenna, local area network, or remote area network.

D/A converter 122 may be any suitable device for converting digital image signals to analog image signals and is preferably implemented through a personal computer (PC)-based display system such as a VGA or SVGA system. Monitor 204 may be any means for displaying analog image signals and is preferably a VGA monitor.

Referring now to FIG. 2, decoding system 200 is preferably a general microprocessor-based personal computer (PC) system similar to the basic PC system of encoding system 100. In particular, host processor 208 may be any suitable means for decoding and scaling encoded image signals and is preferably an Intel® general purpose microprocessor such as an Intel® 386, 486, or Pentium® processor. Host memory 214 may be any suitable memory device used in conjunction with host processor 116 and is preferably a combination of random access memory (RAM) and read-only memory (ROM). In an alternative preferred embodiment, decoding system 200 may also have a pixel processor similar to pixel processor 106 of FIG. 1 for decoding the encoded image signals and a display processor such as an Intel® i750® Display Processor for scaling the decoded image signals.

System bus 206 may be any suitable digital signal transfer device and is preferably an Industry Standard Architecture (ISA) bus or Extended ISA (EISA) bus. Mass storage device 212 may be any suitable means for storing digital signals and is preferably a CD-ROM device. Receiver 210 may be any suitable means for receiving the digital signals transmitted by transmitter 118 of encoding system 100. D/A converter 202 may be any suitable device for converting digital image signals to analog image signals and is preferably implemented through a personal computer (PC)-based display system such as a VGA or SVGA system. Monitor 204 may be any means for displaying analog image signals and is preferably a VGA monitor.

In a preferred embodiment, encoding system 100 of FIG. 1 and decoding system 200 of FIG. 2 are two distinct computer systems. In an alternative preferred embodiment of the present invention, a single computer system comprising all of the different components of systems 100 and 200 may be used to encoded and decoded video image signals. Those skilled in the art will understand that such a combined system may be used to display decoded video image signals in real time during the capture and encoding of video signals to monitor the encoding processing. In a preferred embodiment encoding system 100 encodes video image signals in real time to yield an encoded bitstream, and transmits the encoded bitstream to decoding system 200. Decoding system 200 is configured to implement the decoding method of the present invention, as described in further detail hereinbelow.

Figure 3:
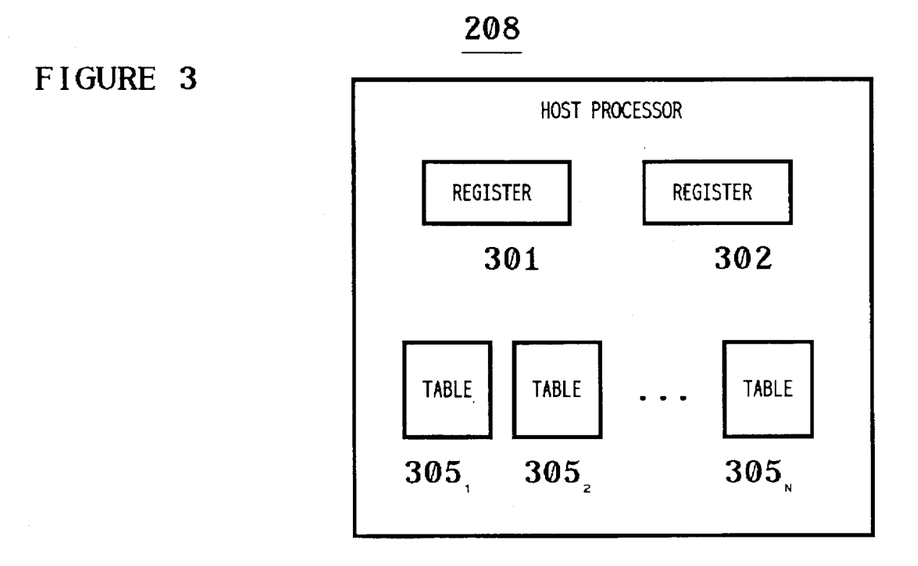
FIG. 3 is a more detailed view of the host processor of the decoding system of FIG. 2, including registers and tables for use with the host processor, according to a preferred embodiment of the present invention.

Referring now to FIG. 3, there is shown a more detailed view of host processor 208 of decoding system 200 of FIG. 2, including registers 301 and 302 and tables $305_1$ to $305_n$ for use with host processor 200, according to a preferred embodiment of the present invention. As will be understood, tables $305_1$ to $305_n$ may be RAM tables within host processor 208. The size of each table $305_i$ may be different from that of other tables, as described further below. As will be understood, the subscript i of a table $305_i$ is equal to the bit size of bytes which are applied to index table $305_i$. Thus, for example, a 5-bit byte can be applied to a table $305_5$, and an 8-bit byte can be applied to a table $305_8$. It will be appreciated that tables $305_1$ to $305_n$ may be stored within other memory devices such as ROM within decoding system 200 in alternative preferred embodiments of the present invention. Registers 301 and 302 are 8-bit registers which may also be located within other components of decoding system 200.

Bit-Level Decoding

In the present invention, the decoding process is speeded up by tabulating the most common VLC codes to reduce use of the binary tree itself, as explained in further detail hereinbelow. In a preferred embodiment as described with reference to FIG. 4, host processor 208 has efficient bit handling and may efficiently decode on a bit level.

Figure 4:
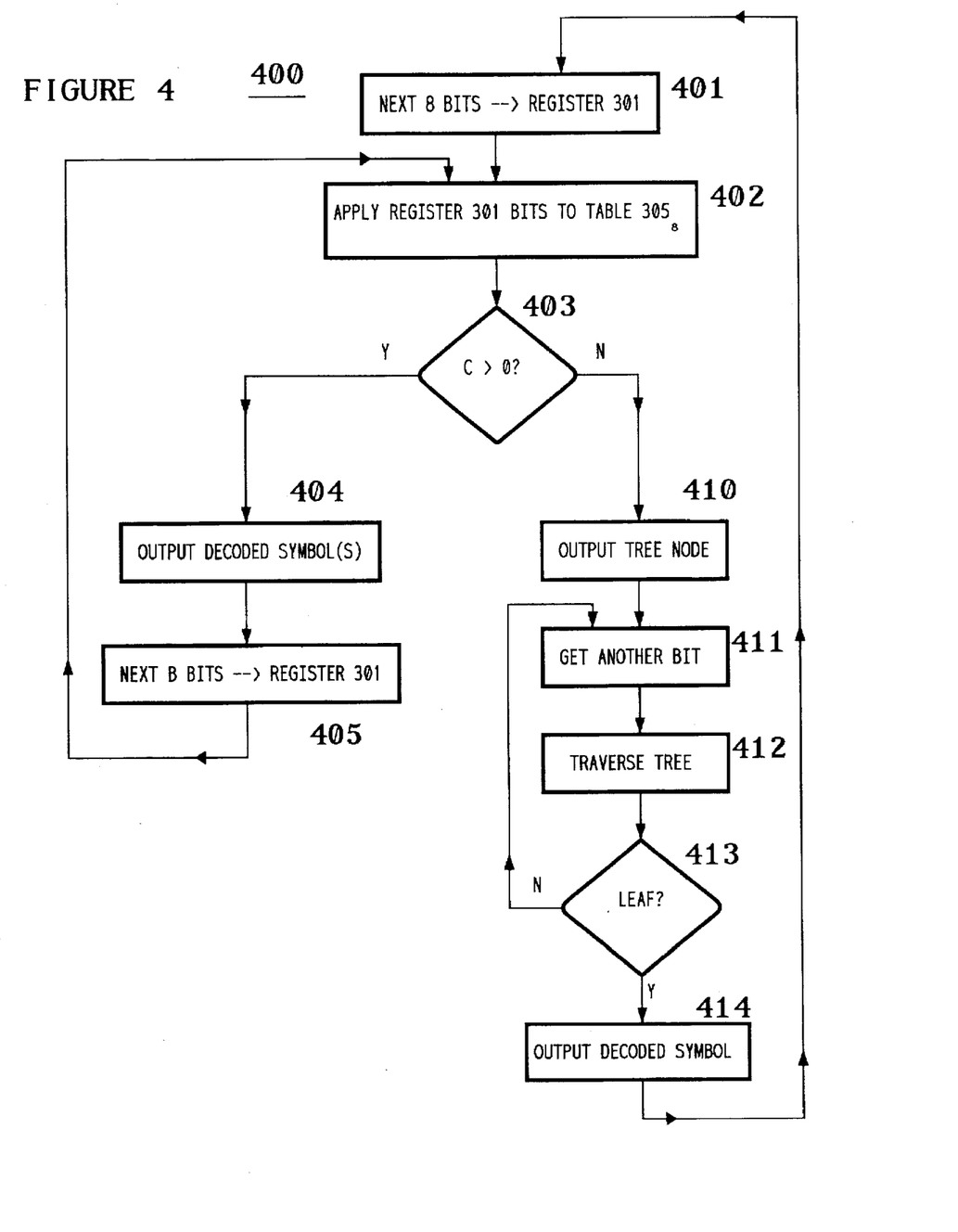
FIG. 4 is a flow chart of the method of decoding of the present invention.

Referring now to FIG. 4, there is shown a flow chart 400 of the method of decoding of the present invention. First, register 301 is filled with the next 8 bits from the encoded bitstream which are to be decoded (step 401 of FIG. 4). As will be understood, any successive 8 bits of the encoded bitstream received from encoding system 100 may contain from zero to 8 complete code words. The 8 bits in register 301 are then applied to table $305_8$ (step 402). Table $305_8$ contains 256 entries for each of the possible combinations of the 8 bits in register 301 that are applied to the table. Each entry in table $305_8$ contains information fields as illustrated in Table 1 below:

TABLE 1

| Field: | Number of Codes C | Decoded Symbols or Tree Node | # of Bits Used B |
|---|---|---|---|
| Range: | 0 to 8 | C codes or one node | 0 to 8 |

The first field, "Number of Codes," tells the number C of complete codes within the 8 bits applied to table $305_8$. The "Decoded Symbols or Tree Node" field is an ordered, serial list of the symbols decoded from the complete code words. Alternatively, when there are no complete codes, this field points to the relevant node of the tree as described below. The "# of Bits Used" field specifies the number B of bits that comprise the complete codes decoded into symbols by table $305_8$. Thus, for example, the first five bits of the 8 input bits may contain three complete codes, which decode into symbols "A", "E", and "S", with five bits being used. Thus, C=3, B=5, and the decoded symbols are "A", "E", and "S" in the current example.

As will be understood, the number of unused bits is thus 8-B or, in general, BS-B. If the number of codes C is more than zero (and thus if the number of used bits B is more than zero), the decoded symbols are output (steps 403 and 404), and the next B bits are read into register 301 (step 405) while shifting the unused BS-B bits over, so that register 301 once more contains 8 undecoded bits.

In a preferred embodiment, the above steps are repeated, to continually output decoded symbols and to read in more bits to fill up register 301. However, some code words may be greater than 8 bits in length, in which case the first 8 bits of the code word, when applied to table $305_8$, will not produce any decoded symbols. In this situation, C=0, B=0, and table $305_8$ produces the node of the Huffman tree that would be reached in standard decoding techniques after traversing the tree with the first 8 bits of the code word. Thus, if C=0, then the tree node is output (steps 403 and 410). Thereafter, subsequent bits are read into register 301 and the tree is traversed in the standard manner until a leaf is reached and the decoded symbol is output (steps 411–414).

Once the symbol is decoded from the Huffman tree, the process is repeated so that the next 8 bits from the bitstream are read once more into register 301 (steps 414 and 401) and the above-described steps are repeated. In this manner, code words that are 8 or fewer bits are decoded without resort to standard tree traversing techniques. For code words greater than 8 bits, the first 8 tree traversals are skipped, thereby speeding up the decoding process. Those skilled in the art will appreciate that bits read from the bitstream in this manner may be read from bytes from the incoming bitstream which are buffered in RAM.

As will be understood by those skilled in the art, in a preferred embodiment the size of register 301 in bits is the same as the size of bytes applied to index a table 305. Thus, if register 301 contains 8 bits, table $305_8$ is utilized. For a 16-bit register, a 16-bit table such as a table $305_{16}$ may be utilized instead of table $305_8$. Those skilled in the art will appreciate that the larger the size of register 301, the larger table will be required, but the less seldom will an incomplete code be contained in register 301 when applied to the relevant table. Those skilled in the art will also appreciate that if the length of code words in the code is limited to the size of register 301, then no incomplete code words will ever be produced when register 301 is applied to the relevant table, and no standard tree traversal techniques need be resorted to.

In an alternative preferred embodiment, the number of codes output by applying the 8 bits in register 301 to table $305_8$ is limited to either zero or one. Thus, in this embodiment each entry in table $305_8$ contains information fields as illustrated in Table 2 below:

TABLE 2

| Field: | Decoded Symbol or Tree Node | # of Bits Used B |
| --- | --- | --- |
| Range: | N/A | 0 to 8 |

As will be appreciated by those skilled in the art, a table such as Table 2 can utilize smaller field entries which have a fixed length, as opposed to entries of Table 1, which are of variable length because the number of decoded symbols is variable.

If register 301 contains at least one complete code, then the first field, "Decoded Symbol or Tree Node," contains the symbol decoded by table $305_8$ from the first complete code (of B bits) from the 8 bits of register 301, in which case the "# of Bits Used" field outputs "B" to indicate the number of bits used in the first complete code. After the symbol is decoded, B bits are read once more into register 301 and the process is repeated. If, however, register 301 contains only a partial code, then the first field provides the tree node which may be accessed to speed up normal tree traversal as described above with reference to Table 1. Those skilled in the art will appreciate that if B is 0, then no bits are used and the value in the first field must be a node value rather than a decoded symbol.

Byte-Level Decoding

In an alternative preferred embodiment, as will be appreciated by those skilled in the art, host processor 208 does not have efficient bit handling or is otherwise configured to decode on a byte level. In this embodiment, two registers 301 and 302, as shown in FIG. 3, may be utilized, each of size 8 bits. In general, the size of this initial byte may be referred to herein as size S. Host processor 208 also includes tables $305_8$ to $305_{2*S-1}$, i.e. tables $305_8$ to $305_{15}$ for S=8. In the general case, a byte of byte size BS bits, where S≦BS≦ (2*S)−1, may be applied to a table $305_{BS}$.

Figure 5:
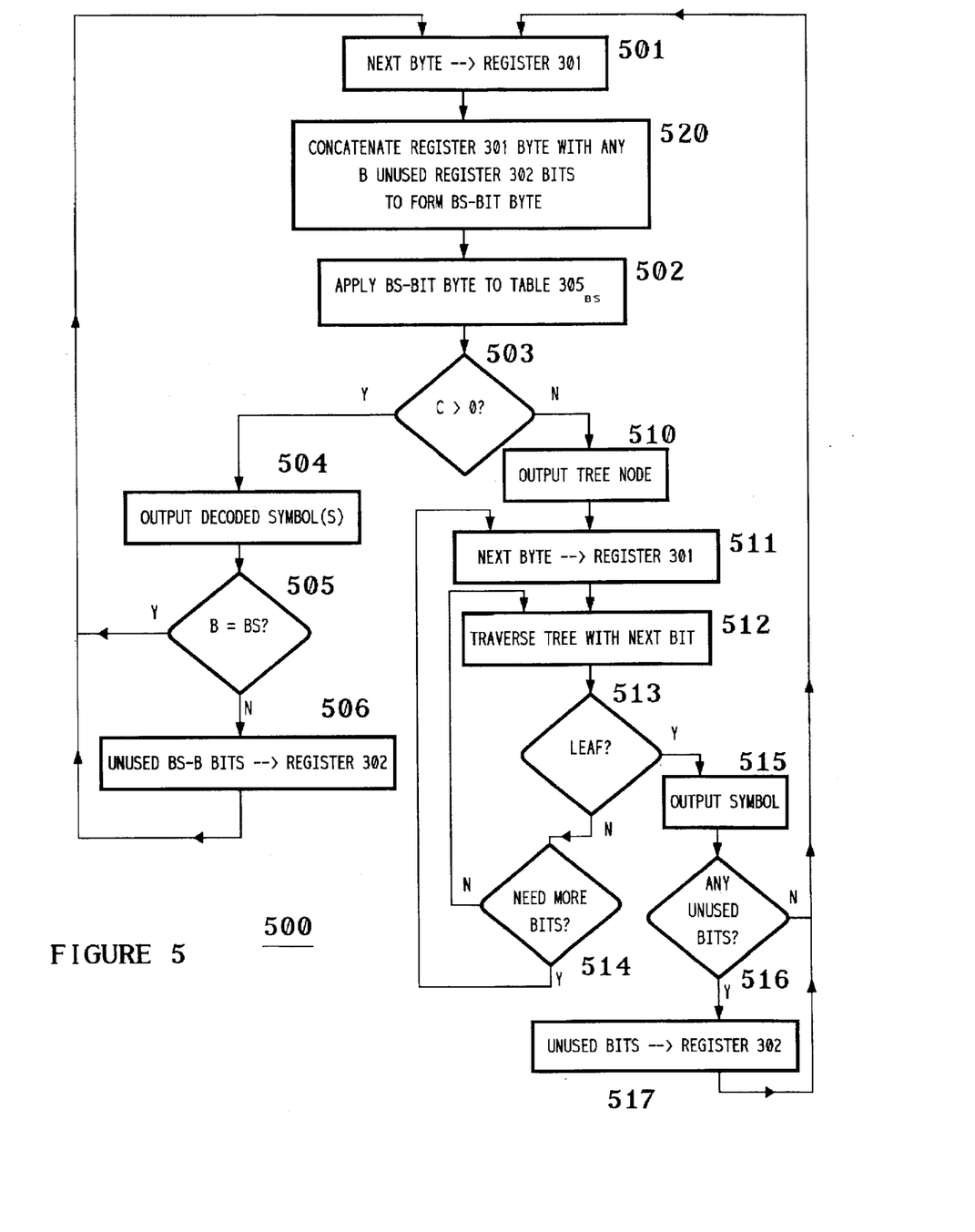
FIG. 5 is a flow chart of an alternative preferred method of decoding of the present invention.

Referring now to FIG. 5, there is shown a flow chart 500 of an alternative preferred method 500 of decoding of the present invention. Method 500 is similar in operation to method 400 described above, but utilizes two registers 301 and 302 and a larger number of tables because host processor 208 decodes on a byte level. First, register 301 is filled with the next 8-bit byte from the encoded bitstream (step 501 of FIG. 5). As will be understood, a given byte, which contains 8 successive bits of the encoded bitstream, may contain from zero to 8 complete code words, along with the first 8 to zero bits of the next incomplete code word.

The 8-bit byte in register 301 is then concatenated with any unused bits in register 302 (step 520), to form a byte having BS bits. Initially, there will be no unused bits in register 302, so the relevant byte is the 8-bit byte in register 301, so that BS=8. The byte is then applied to table $305_{BS}$= $305_8$ (step 502). Each entry in table $305_8$ contains information fields as illustrated in Table 1 described above. When the byte in register 301 is applied to table $305_8$, the table provides C, the number of complete codes within the input byte, and B, the number of bits used. If B and C are greater than zero, i.e. at least one code has been decoded, table $305_8$ provides an ordered, serial list of the symbol(s) decoded from the complete code word(s) within the input byte (steps 503 and 504).

If B=8, there are no unused bits left over and the next byte is read into register 301 (steps 505 (with BS=8) and 501). If 0<B<8, then some codes have been decoded and 8-B unused bits are left over. Thus, if B<>8, the 8-B unused bits are shifted into register 302 (step 506), and the next byte is read into register 301 (step 501). Unused bits stored in register 302, if any, are concatenated with the 8-bit byte in register 301 to form a new byte of bitsize BS=8+(BS-B), i.e. from 9 to 15 bits, since BS-B ranges from 1 to 7 (step 520) when there are unused bits left over in step 505. It will be understood that when B=BS (step 505) and no unused bits are left over, register 302 is cleared and no bits are concatenated with the next 8-bit byte read into register 301. In this case, the BS-bit byte of step 502 has 8 bits and is applied to table $305_8$.

This new byte is then applied to the table of size BS, i.e. to table $305_{BS}$. For example, if B=5, then 3 bits are left over, and BS=11. In this example, the 11-bit byte is applied to table $305_{11}$. As is the case when table $305_8$ is utilized, table $305_{11}$ provides C, the number of complete codes within the input byte, and B, the number of bits used. If B and C are greater than zero, table $305_{11}$ provides an ordered, serial list of the symbols decoded from the complete code words within the input byte (steps 503 and 504). It will be understood that if B=BS for a given table $305_{BS}$, then there are no unused bits and the next byte is read into register 301 (steps 505 and 501).

However, some code words may be greater than BS bits in length, for both the initial 8-bit byte and for subsequent bytes applied to table $305_{BS}$, in which case the BS bits of register 301 is concatenated with any unused bits in register 302, when applied to table $305_{BS}$, will not produce any decoded symbols. Thus, when any of tables $305_8$ to $305_{15}$ are utilized in the above-described manner and C=0(i.e., no codes are produced), the relevant table $305_{BS}$ provides the relevant node of the tree that would be reached normally by traversing the tree serially using the BS successive bits of the input byte. Thus, as described above with reference to Table 1, if C=0, then the tree node is output (steps 503 and 510). Thereafter, new bytes are read into register 301 and bits of the current byte in register 301 are used to traverse the tree in the standard manner until a leaf is reached and the decoded symbol is output (steps 511–515).

After a leaf is reached and the decoded symbol output, a number of bits from 1 to 7 of the last byte read into register 301 may be left over. If there are any such unused bits (step 516), they are shifted into register 302 (step 517), a new byte is read into register 301 (step 501), and these are concatenated as described above (step 520). Otherwise, a new byte is read into register 301 (step 501) and BS=8.

In this manner, code words that have less than BS bits (i.e. from 8 to 15 bits, depending upon the current byte size being utilized) are decoded without resort to standard tree traversing techniques. For code words greater than BS bits, the first BS tree traversals are skipped, thereby speeding up the decoding process.

As will be understood by those skilled in the art, in a preferred embodiment the size of register 301 is 8 bits, in which case the relevant tables range from 8 to 15 bits in size. For larger size initial byte implementations register 301 has a larger size S, and tables range from size S to size $2*S-1$.

Figure 6:
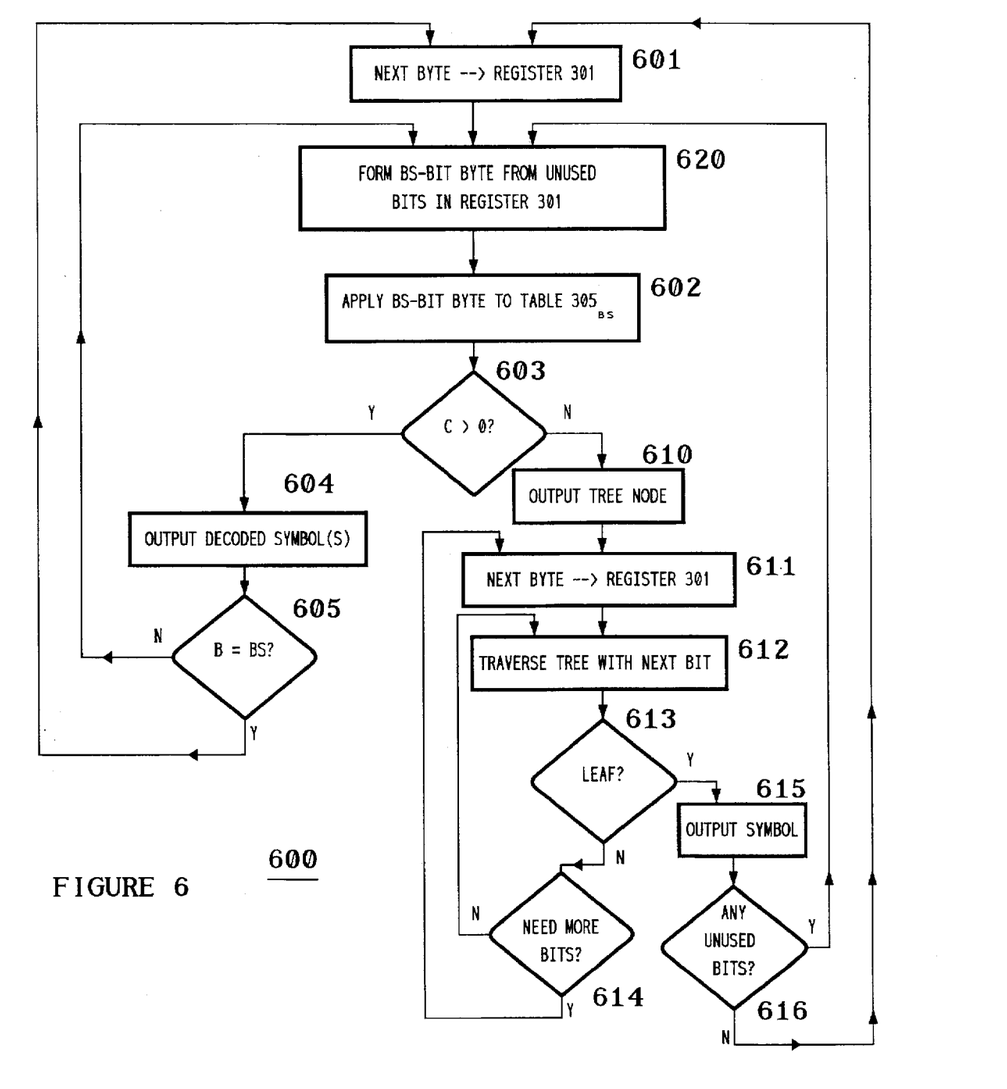
FIG. 6 is a flow chart of another alternative preferred method of decoding of the present invention.

Referring now to FIG. 6, there is shown a flow chart 600 of another alternative preferred method 600 of decoding of the present invention. Method 600 is similar in operation to method 500 described above, but utilizes only one register 301 and uses smaller tables than described with reference to flow chart 500. In a preferred embodiment, the size S of the initial byte and of register 301 is 8 bits. Host processor 208 also includes tables $305_1$ to $305_S$, i.e. tables $305_1$ to $305_8$ for S=8. As will be understood, a byte of byte size BS bits, where $1 \leq BS \leq S$, is applied to index a table $305_{BS}$.

In method 600, register 301 is first filled with the next 8-bit byte from the encoded bitstream (step 601 of FIG. 6). A byte of size BS bits, where $1 \leq BS \leq 8$, is formed from any unused bits in register 301. Initially, BS will be 8 because register 301 will contain 8 unused bits. The 8-bit byte is then applied to table $305_8$ (step 602). Each entry in table $305_8$ contains information fields as illustrated in Table 1 described above. As described above with reference to Table 1, when the byte in register 301 is applied to table $305_8$, the table provides C, the number of complete codes within the input byte, and B, the number of bits used. If B and C are greater than zero, table $305_8$ provides an ordered, serial list of the symbols decoded from the complete code words within the input byte (steps 603 and 604).

If B=8, there are no unused bits left over, and the next byte is thus read into register 301 (steps 605 (with BS=8) and 601). If, however, 0<B<8, then some codes have been decoded and 8-B bits are left over after step 604. Thus, if B<>8, the 8-B unused bits are used to form a BS-bit byte (step 620) that is then applied to the appropriate BS-sized table $305_{BS}$ (step 602). When the BS-bit byte in register 301 is applied to table $305_{BS}$, the table provides C and B, and the method proceeds as described above.

As described hereinabove, some code words may be greater than BS bits in length, for both the initial 8-bit byte and for subsequent BS-bit bytes applied to table $305_{BS}$, in which case the BS bits of register 301, when applied to table $305_{BS}$, will not produce any decoded symbols. Thus, when any of tables $305_1$ to $305_8$ are utilized in the above-described manner and C=0 (i.e., no codes are produced), table $305_{BS}$ provides the relevant node of the tree that would be reached normally by traversing the tree serially using the BS successive bits of the input byte. Thus, if C=0, then the tree node is output (steps 603 and 610). Thereafter, new bytes are read into register 301 and bits of the current byte in register 301 are used to traverse the tree in the standard manner until a leaf is reached and the decoded symbol is output (steps 611–615).

After a leaf is reached and the decoded symbol output, a number of bits from 1 to 7 of the last byte read into register 301 may be left over. If there are no such unused bits, the next byte is read into register 301 (steps 616 and 601) and BS=8. If, however, there are unused bits left over in register 301, the unused bits are used to form a BS-bit byte (steps 616 and 620) that is then applied to the table $305_{BS}$ (step 602), and the above-described process is repeated.

In this manner, code words that have less than BS bits (i.e. from 1 to 8 bits, depending upon the current byte size being utilized) are decoded without resort to standard tree traversing techniques. For code words greater than BS bits, the first BS tree traversals are skipped, thereby speeding up the decoding process.

As will be understood by those skilled in the art, in a preferred embodiment the size of register 301 is 8 bits, in which case the relevant tables range from 1 to 8 bits in size. For larger size initial byte implementations register 301 has a larger size S, and tables range from size 1 to S.

It will be understood that various changes in the details, materials, and arrangements of the parts which have been described and illustrated above in order to explain the nature of this invention may be made by those skilled in the art without departing from the principle and scope of the invention as recited in the following claims.

What is claimed is:

1. A computer-implemented method for decoding code words of an encoded bitstream associated with a variable-length code, the method comprising the steps of:
   (a) forming with a processor a byte having BS bits in accordance with bits of the encoded bitstream and in accordance with any unused bits remaining after decoding a previous code word;
   (b) applying the byte to a table means;
   (c) if the byte comprises at least one complete code word, then:
      (1) producing with the table means at least one decoded symbol corresponding to the at least one complete code word; and
      (2) determining a plurality of unused bits comprised of bits of the byte not within the at least one complete code word; and
   (d) if the byte does not comprise at least one complete code word, then:
      (1) producing with the table means a node of a binary tree associated with the variable-length code in accordance with the byte, and
      (2) traversing the binary tree starting from the node until a decoded symbol is produced.

2. The method of claim 1, further comprising the step of:
   (e) repeating steps (a)–(c) until the byte does not comprise at least one complete code word.

3. The method of claim 1, wherein step (a) comprises the steps of:
   (1) if the previous code word was decoded using tree traversal, then reading BS bits from the encoded bitstream to form the byte;
   (2) else concatenating the plurality of unused bits with further bits of the encoded bitstream to form the byte.

4. The method of claim 1, wherein: step (a) comprises the steps of:
   (1) reading S bits from the encoded bitstream to form a second byte; and
   (2) concatenating the any unused bits with the second byte to form the byte; and step (d) further comprises the step of:
   (3) determining a second plurality of unused bits comprised of bits of a last byte read from the encoded bitstream that do not correspond to the decoded symbol produced in step (d)(2).

5. The method of claim 1, wherein:
   step (a) comprises the steps of:
   (1) if any unused bits remain after decoding the previous code word, then forming the byte from the any unused bits; and
   (2) else reading BS bits from the encoded bitstream to form the byte; and step (d) further comprises the step of:
   (3) determining a second plurality of unused bits comprised of bits of a last byte read that do not correspond to the decoded symbol produced in step (d)(2).

6. The method of claim 1, wherein:
   step (c) (1) comprises the step of producing with the table means decoded symbols corresponding to each complete code word within the byte; and
   step (c) (2) comprises the step of determining a plurality of unused bits comprised of bits of the byte not within any of the complete code words within the byte.

7. The method of claim 1, wherein:
   step (c) (1) comprises the step of producing with the table means a single decoded symbol corresponding to the one complete code word; and
   step (c) (2) comprises the step of determining a plurality of unused bits comprised of bits of the byte not within the one complete code word.

8. An apparatus for decoding code words of an encoded bitstream associated with a variable-length code, the apparatus comprising:
   (a) processor means for forming a byte having BS bits in accordance with bits of the encoded bitstream and in accordance with any unused bits remaining after decoding a previous code word;
   (b) table means and means for applying the byte to the table means, wherein if the byte comprises at least one complete code word, the table means produces at least one decoded symbol corresponding to the at least one complete code word, further wherein, if the byte does not comprise at least one complete code word, then the table means produces a node of a binary tree associated with the variable-length code in accordance with the byte;
   (c) means for determining, if the byte comprises at least one complete code word, a plurality of unused bits comprised of bits of the byte not within the at least one complete code word; and
   (d) means for traversing, if the byte does not comprise at least one complete code word, the binary tree starting from the node until a decoded symbol is produced.

9. The apparatus of claim 8, further comprising:
   (e) means for repeating the functions of means (a)–(c) until the byte does not comprise at least one complete code word.

10. The apparatus of claim 8, wherein the processor means comprises:
    (1) means for reading, if the previous code word was decoded using tree traversal, BS bits from the encoded bitstream to form the byte; and
    (2) means for concatenating, otherwise, the plurality of unused bits with further bits of the encoded bitstream to form the byte.

11. The apparatus of claim 8 wherein:
    the processor means comprises:
    (1) means for reading S bits from the encoded bitstream to form a second byte; and
    (2) means for concatenating the any unused bits with the second byte to form the byte; and
    further comprising:
    (e) means for determining, if the byte does not comprise at least one complete code word, a second plurality of unused bits comprised of bits of a last byte read from the encoded bitstream that do not correspond to the decoded symbol produced by means (d).

12. The apparatus of claim 8, wherein:
    the processor means comprises:
    (1) means for forming the byte from the any unused bits if any unused bits remain after decoding the previous code word; and
    (2) means for reading BS bits from the encoded bitstream to form the byte otherwise; and
    further comprising:
    (e) means for determining, if the byte does not comprise the at least one complete code word, a second plurality of unused bits comprised of bits of a last byte read that do not correspond to the decoded symbol produced by means (d).

13. The apparatus of claim 8, wherein:
    if the byte comprises at least one complete code word, the table means produces decoded symbols corresponding to each complete code word within the byte; and
    means (c) comprises means for determining, if the byte comprises the at least one complete code word, a plurality of unused bits comprised of bits of the byte not within any of the complete code words within the byte.

14. The apparatus of claim 8, wherein:
    if the byte comprises at least one complete code word, the table means produces a single decoded symbol corresponding to the one complete code word; and
    means (c) comprises means for determining, if the byte comprises the at least one complete code word, a plurality of unused bits comprised of bits of the byte not within the one complete code word.

15. The apparatus of claim 14, wherein the apparatus is electrically connected to a bus and the bus is electrically connected to a memory device.

16. The apparatus of claim 8, wherein the apparatus is electrically connected to a bus and the bus is electrically connected to a memory device.

* * * * *